United States Patent [19]
Petry, III

[11] Patent Number: 5,676,302
[45] Date of Patent: Oct. 14, 1997

[54] METHOD AND APPARATUS FOR CRESCENT BOUNDARY THRESHOLDING ON WIRE-BONDED LEADS

[75] Inventor: John P. Petry, III, West Newton, Mass.

[73] Assignee: Cognex Corporation, Natick, Mass.

[21] Appl. No.: 520,937

[22] Filed: Aug. 31, 1995

Related U.S. Application Data

[63] Continuation-in-part of Ser. No. 458,908, Jun. 2, 1995.
[51] Int. Cl.$^6$ .......................... B23K 31/12; B23K 37/00
[52] U.S. Cl. ..................... 228/104; 228/105; 228/56.5
[58] Field of Search ................................ 228/104, 105, 228/56.5

[56] References Cited

U.S. PATENT DOCUMENTS

| | | | |
|---|---|---|---|
| 4,944,447 | 7/1990 | Thorne | 228/104 |
| 5,156,319 | 10/1992 | Shibasaka et al. | 228/104 |
| 5,509,597 | 4/1996 | Laferriere | 228/105 |
| 5,532,739 | 7/1996 | Garakani et al. | 348/87 |

OTHER PUBLICATIONS

"Algorithm for Detecting Solder Joints' Defects Using K–L Transformation," *IBM Tech. Discl. Bull.*, vol. 36, No. 11 (Nov. 1993) pp. 379–380.

*Primary Examiner*—P. Austin Bradley
*Assistant Examiner*—Jeffrey T. Knapp
*Attorney, Agent, or Firm*—Maureen Stretch

[57] ABSTRACT

Method and apparatus for selecting a threshold for use by a boundary tracker to locate a crescent on a bonded lead involves creating a two-dimensional inspection window along the angle of the wire in a post-bond image of a bonded wire in order to generate a one-dimensional projection; generating a one-dimensional projection by summing each column of pixels in the inspection window in the direction of the wire angle and computing an average grey value for each column; and applying an edge-detection to the one-dimensional projection to locate the edges of the wire. If an edge point falls directly in the center of a pixel of the one-dimensional projection, the grey value for that edge point is considered to be the grey value of that pixel. If the edge falls between pixels, the edge's grey value is determined by the fractional pixel position of the edge point in the projection. The grey values of the left and right edge points are averaged and used as the threshold value. For more accurate threshold selection or if reflective stripes or confusing edges are likely to occur in the parts being inspected, the same steps are performed using a clipped difference image of the bonded wire instead of a post-bond image.

12 Claims, 10 Drawing Sheets

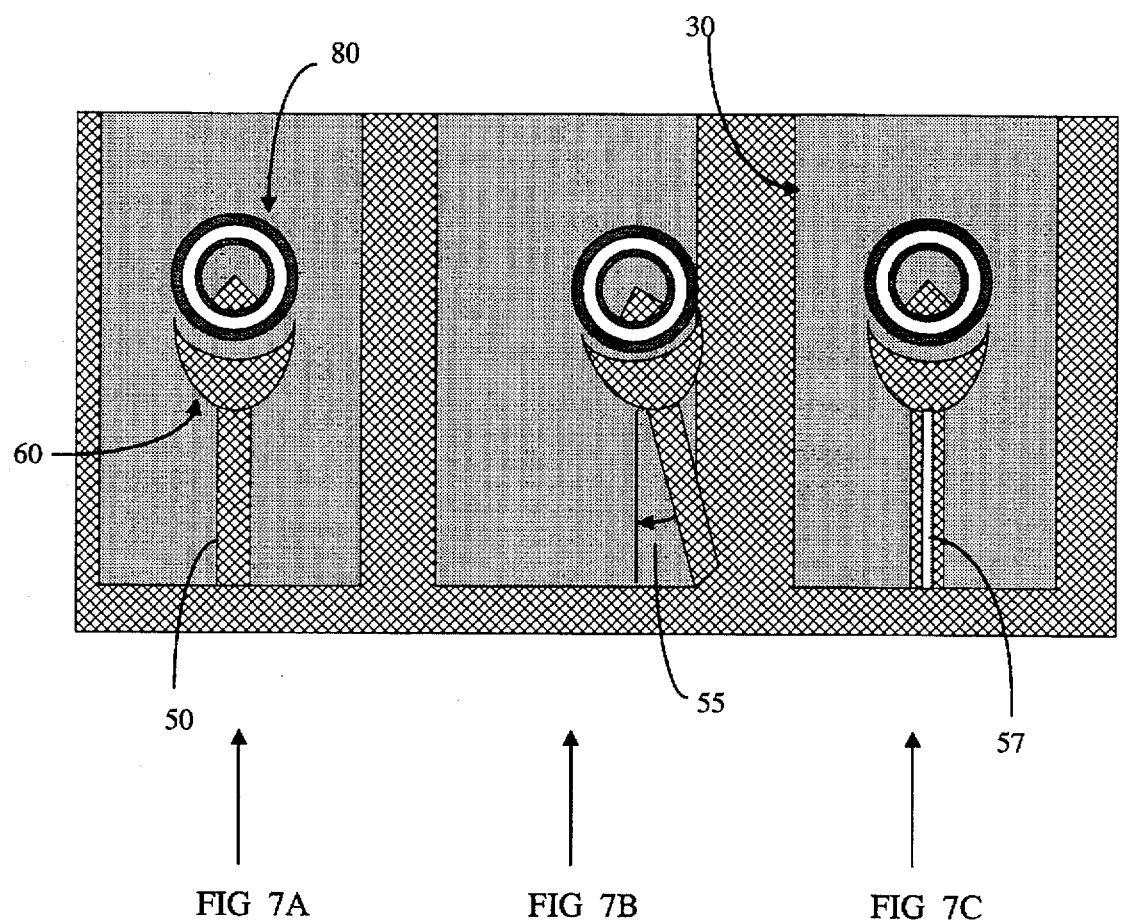

METHOD AND APPARATUS FOR CRESCENT BOUNDARY THRESHOLDING ON WIRE-BONDED LEADS

This application is a continuation-in-part of application Ser. No. 08/458,908, filed Jun. 2, 1995.

BACKGROUND OF THE INVENTION

This invention relates generally to machine vision systems and semiconductor chip wire bonding devices, and similar bonding apparatus, and particularly to a method and apparatus for selecting a threshold to use in locating and inspecting the crescent of a bond formed on a lead on a semiconductor chip.

Integrated circuit manufacturers generally want to improve the quality of their manufacturing and reduce their costs. In applications such as wire bonding of semiconductor integrated circuits inspection is used to help accomplish this.

A human inspector can only inspect on a sampled basis after bonding has taken place. Automatic inspection can inspect the bond while it is still on the wirebonder machine perhaps allowing feedback to the machine to improve its operating parameters or allowing immediate rework of the part. Automatic inspection can be run exhaustively on all parts being manufactured while human inspection is too expensive to permit this.

During wire bonding, a wire runs through a capillary, which is a hollow metal tube. To bond the wire to a lead, the capillary is pressed firmly against the lead and vibrated at high frequency. This forms a connection between the lead 30 and that portion of the wire 50 under the edge of the capillary 70 as seen in FIG. 6. The part of the wire which is flattened by the capillary spreads out in a crescent-shaped region known as the crescent 60 as seen in FIG. 2a.

In the inspection of bonded leads, a key feature is this crescent (sometimes known as the stitch), which is the point of electrical contact between a wire and the lead to which it is being bonded. Knowing the position and extent of the crescent is vital because this is the primary determination of whether or not a good bond has been formed.

When visually inspecting the quality of the bond, it is desirable to know the crescent's position and size. The size can be best inferred by tracing its boundary and measuring the extrema to determine its width and height, as described in co-pending application C93-021, application Ser. No. 08/458,908, filed Jun. 2, 1995 Boundary Tracking Method and Apparatus to Find Leads, assigned to the same Assignee as this invention and of which this is a continuation in part. Unfortunately, there is no practical technique to determine the grey-level threshold of the crescent's boundary from the crescent itself, since its shape is not consistent (which is why the width and height must be measured).

However, the wire below the crescent is usually quite stable in appearance, except for the possible presence of a reflective stripe under certain lighting conditions. Its apparent diameter (or width, in a two-dimensional image) and its polarity relative to the lead background (darker or lighter) are also very consistent as long as it does not diverge from the lead.

Methods such as those described in co-pending application Ser. No. 08/458,908 above, make use of this consistency of the wire to establish threshold values.

A crescent boundary tracker requires two main inputs: the location of the crescent base, which it uses as a starting point ( as described in co-pending patent application Apparatus And Method For Inspecting Wire Bonds On Leads, Attorney Docket Number C95-007, application Ser. No. 08/520,935, filed Jun. 30, 1995 assigned to the same Assignee as this invention, and which is hereby incorporated by reference) and a binarization threshold to distinguish the crescent from the lead background.

This second step of selecting a binarization threshold is currently done by one of two methods as described in the above referenced co-pending application Ser. No. 08/458,908, both of which have difficulties under certain conditions. These methods are indirect, that is, they are based on assumptions about relationships in the bond image which may not always hold true. For example, they use the expected wire width to select edges and compute the threshold. If the wire appears larger or smaller than this expected width, because of changes in camera angles or other conditions, the values selected will not be useful. In addition, prior methods are susceptible to two types of image degradation.

The first type of degradation occurs under some lighting conditions, when a bright white reflective stripe appears down the center of the wire. This may cause some methods that rely on an expected wire width to fail. If the wire has such a reflective highlight, one of the edges of the reflection may be mistaken for the edge of the wire, producing a threshold that is too bright.

The second problem occurs when one edge of the wire lies outside the lead edge, so that one edge of the wire is seen against the black surface of the heating plate, rather than against the lead surface. When this occurs, the wire may not be distinguishable in the image, from surface of the heating plate, and thus tools based on an expected wire width may not locate it.

The variety of parts and lighting conditions often found on a bonder located on a factory floor or otherwise located outside a controlled or laboratory environment are likely to increase the occurrence of these two classes of problems. For example, different parts from the same manufacturer may vary in appearance, or geometry and they may also have different reflective properties. Parts made by another manufacturer may differ from those of the first manufacturer in some or all of those aspects.

Alternatively, the angle of the wire after it is bonded may cause it to have different reflective properties. For example, if the wire overlaps the lead edge, it is not possible to determine a valid threshold from it with the above-described methods because it is seen against a black background, rather than against the lead. It is possible that no edge may be detected on the side, or the edge may be found but the threshold value may be too dark to produce accurate results.

It is an object of the present invention to provide a more reliable method of determining a threshold for the edges of a crescent, to, in turn, permit a more reliable measurement of the crescent's boundaries.

It is another object of the present invention to provide a more robust method of determining a threshold for the edges of a crescent under factory floor conditions.

It is yet another object of the present invention to provide a reliable means of determining a threshold for the edges of a crescent in images that have been degraded either by reflective stripes or by wire placement on the edge of a lead.

Still another object of the present invention is to permit the user to select whether speed or accuracy of the threshold determination is more important for a given type of device being inspected.

SUMMARY OF THE INVENTION

These and other objects are achieved by the present invention by creating a two-dimensional inspection window along the angle of the wire in a post-bond image of a bonded wire in order to generate a one-dimensional projection. The one-dimensional projection is generated by summing each column of pixels in the inspection window in the direction of the wire angle and computing an average grey value for each column. An edge-detection tool is applied to the one-dimensional projection to locate the edges of the wire. If an edge point falls directly in the center of a pixel of the one-dimensional projection, the grey value for that edge point is considered to be the grey value of that pixel. If the edge falls between pixels, the edge's grey value is determined by the fractional pixel position of the edge point in the projection. The grey values of the left and right edge points are averaged and used as the threshold value.

If the user needs a more accurate threshold selection or if reflective stripes or confusing edges are likely to occur in the parts being inspected, the same steps as described above are performed on a difference image of the bonded wire, created by subtracting a pre-bond image of the lead from a post-bond image of the lead, as described in co-pending application Ser. No. 08/132,532, filed Oct. 6, 1993, attorney docket number C93-007, Automated Optical Inspection Apparatus, now abandoned, and the file wrapper continuation thereof, attorney docket number C93-007FWC, application Ser. No. 08/389,437, filed Feb. 15, 1995, now U.S. Pat. No. 5,532,739, assigned to the same Assignee as this invention, which is hereby incorporated by reference.

It is an aspect of the present invention that it permits the user to do threshold selection either on a post-bond image of the wire and crescent, which is faster and usually consumes less memory, or on a difference image which is more accurate while still providing good speed and memory usage.

It is another feature of the present invention that it provides a more robust system for use in factory floor environments, particularly if the invention operates on the difference image.

BRIEF DESCRIPTION OF THE DRAWINGS

FIG. 7a is a schematic top view of a wire bonded to a lead at an expected wire angle.

FIG. 7b is a schematic top view of a wire bonded to a lead at an angle which causes part of the wire to lie outside the lead edge.

FIG. 7c is a schematic top view of a wire bonded to a lead edge, in which the wire shows a reflective stripe in the image.

DETAILED DESCRIPTION

Figure 4:
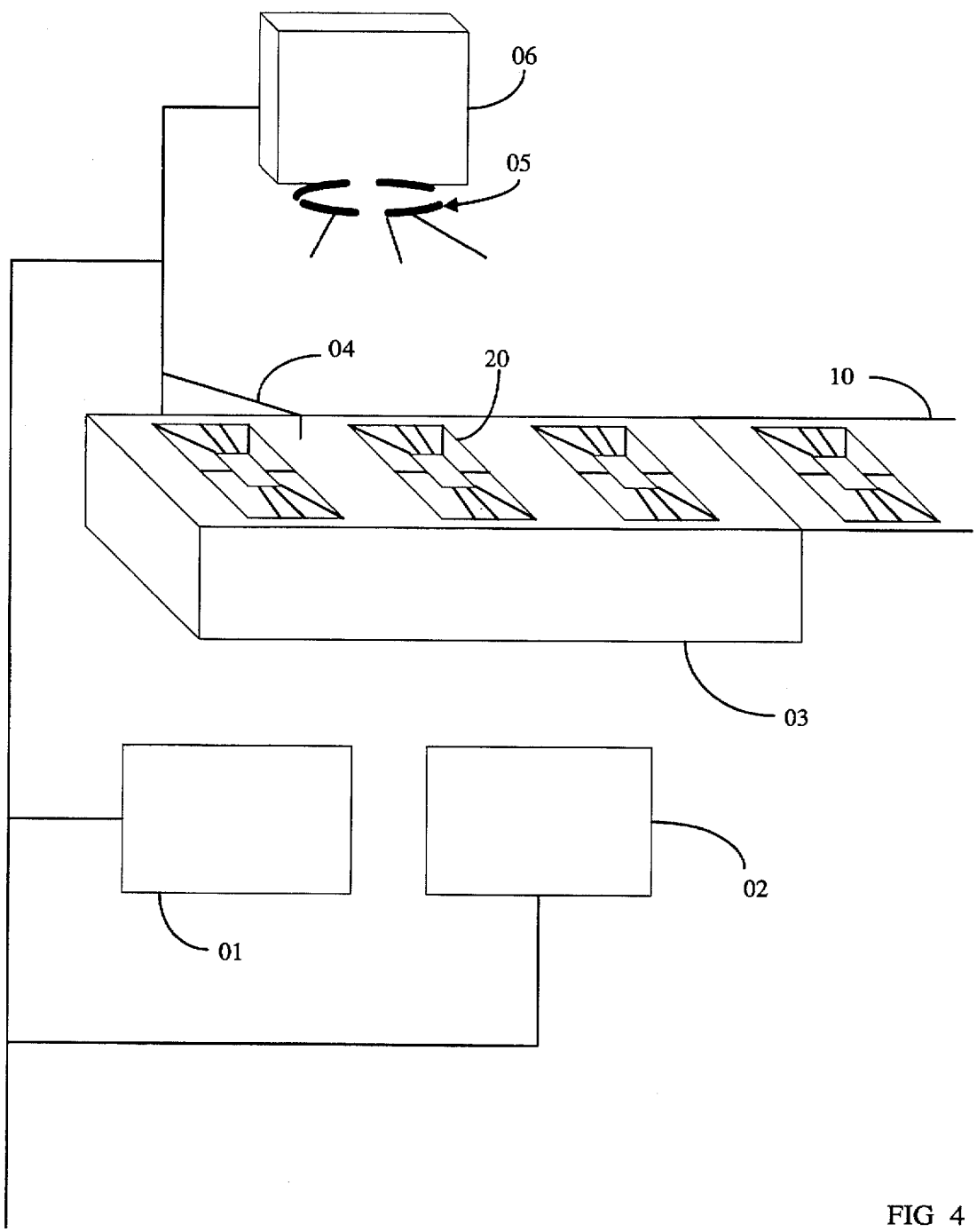
FIG. 4 is a schematic drawing of a wirebonding system according to the method and apparatus of the present invention.
Figure 5:
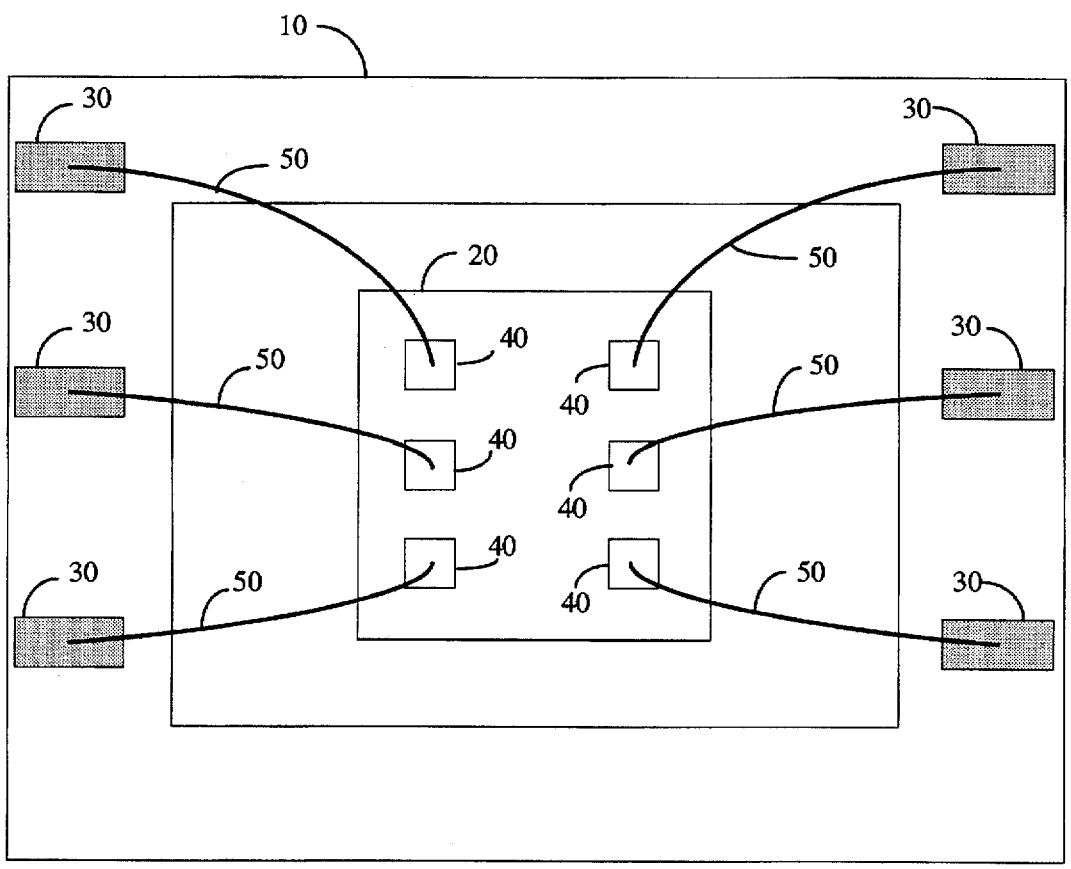
FIG. 5 is a schematic top view of a semiconductor chip with wires bonded to leads.

Turning first to FIG. 4, a wirebonding system according to the method and apparatus of the present invention is shown. In this system, semiconductor chips 20, on leadframes 10 are bonded by a bond head mechanism 04 which is coupled to a host controller 01. Host controller 01 is also coupled to a video camera 06 and an image processor 02. Light 05 provides illumination. FIG. 5 shows a top view of a semiconductor chip 20 in which pads for are bonded by wires 50 to leads 30 on leadflame 10.

Figure 1:
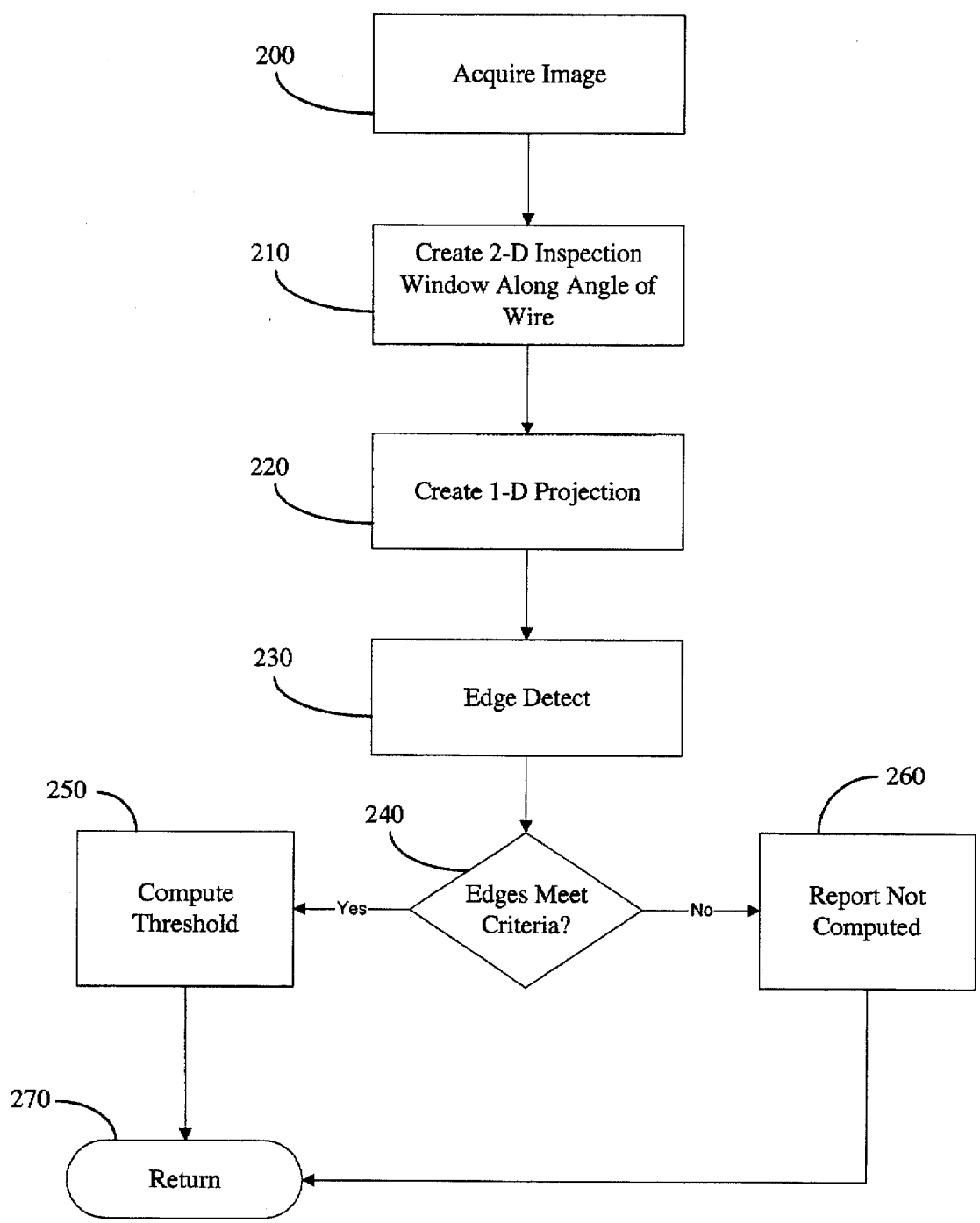
FIG. 1 is a flow diagram of the present invention.

Now turning to the flow diagram in FIG. 1, at step 200 an image is acquired. In this part of the wirebonding process, the image will be that of a wire 50 bonded to a lead 30, as described above. According to the method and apparatus of the present invention, the image will be either a post-bond image or a difference image. Next, at step 210, a two-dimensional inspection window is created within the image along the angle of the wire. From this inspection window, a one-dimensional projection is generated at step 220, by summing the grey values of each column of pixels in the inspection window, averaging the grey value for each column, and storing the result in one bin of a one-dimensional projection such that each bin of the one-dimensional projection is the average grey-value of a column in the inspection window.

Figure 9:
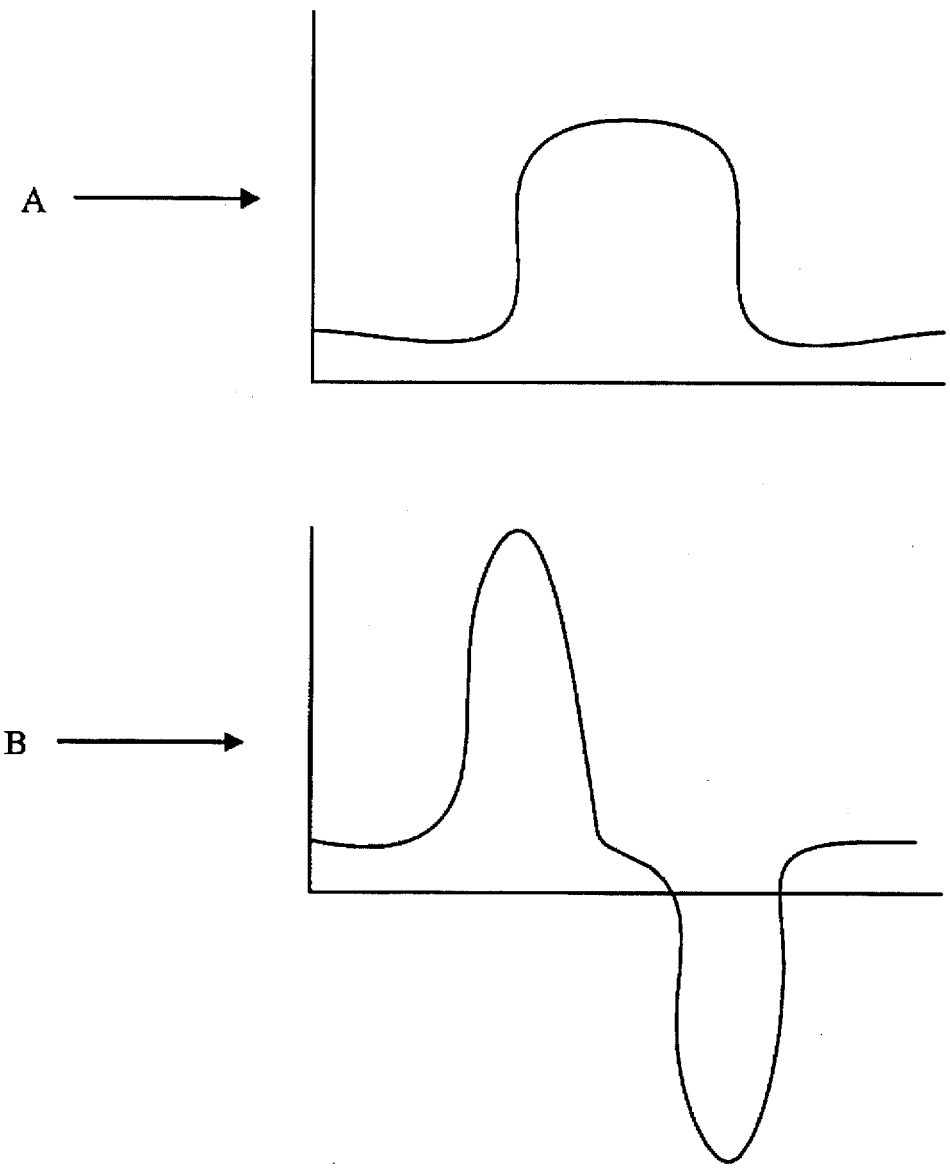
FIG. 9 shows graphs of a one-dimensional projection of a wire and its first derivative according to the method and apparatus of the present invention.

Next, at step 230, an edge detection tool is applied to the one-dimensional projection. Any of a number of edge detection techniques commonly known can be used. In a preferred embodiment, the present invention creates a first derivative B, (as shown in the chart in FIG. 9), of the one-dimensional projection and locates maxima and minima in that as the edges. As will be apparent to those skilled in the art, other techniques could be used.

Returning to FIG. 1, at step 240, a preferred embodiment of the present invention next checks to see whether the grey values of the edges found meet any specified user minimum contrast levels, or whether the edges found represent a width close to the expected wire width. This check is optional in this preferred embodiment.

If the edges do meet any user criteria, the invention proceeds to step 250, to compute a threshold value. If an edge point falls directly in the center of a pixel of the one-dimensional projection, the grey value for that edge point is considered to be the grey value of that pixel. If the edge falls between pixels, the edge's grey value is determined by the fractional pixel position of the edge point in the projection. The grey values of the left and right edge points are averaged and used as the threshold value.

The value computed is made available to the boundary tracker and the present invention ends operation at step 270. If no edges were found that met the optionally specified user criteria, the present invention will report that at step 260 and then end at step 270.

Figure 6:
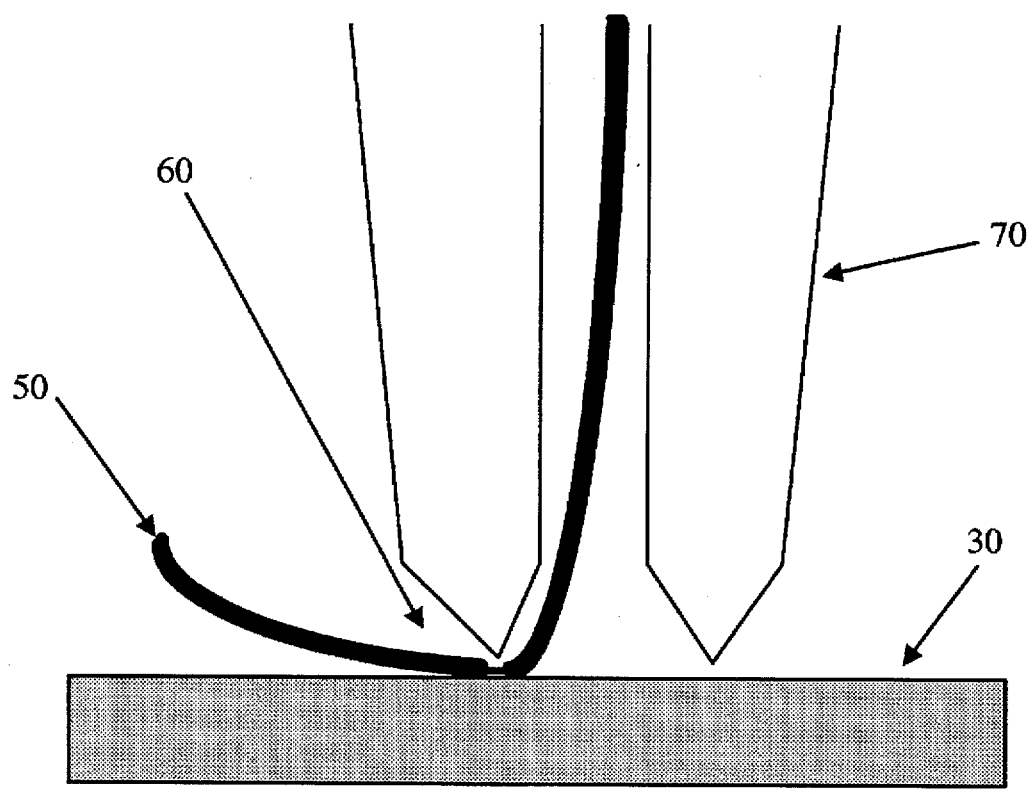
FIG. 6 is a schematic, cutaway side view of a capillary bonding a wire to a lead.
Figure 8A:
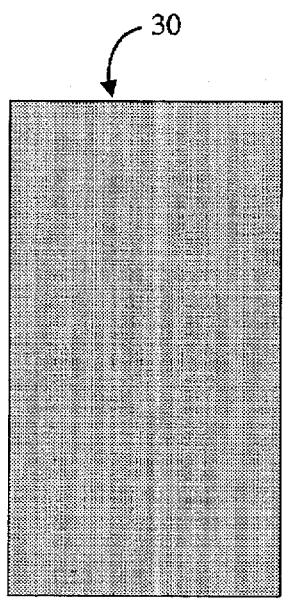
FIG. 8a shows schematic top view of a pre-bond image of a lead.

Now turning to FIG. 8a, a schematic illustration of a pre-bond image of a lead 30 is shown. After wirebonding has occurred, lead 30 may appear as shown in the post-bond image in FIG. 8b. Here wire 50 has been bonded to lead 30. In the wirebonding process, the capillary 70 (shown in FIG. 6) leaves an indentation 80, as shown in FIG. 8a, which shows up as a bright ring in the post-bond image. Slightly below indentation 80 is the crescent 60 which the capillary 70 forms during the bonding process. In order to inspect the quality of the bond on this lead 30, crescent 60 must be located, as it is the point of electrical contact between wire 50 and lead 30. Since the width of wire 50 is the most consistent feature of the bond, it is located first, and the grey values at its edges are used to establish the threshold for a boundary tracker or similar mechanism that attempts to find crescent 60.

As mentioned earlier, the boundary tracker requires two main inputs: the location of the crescent 60's base, which it uses as a starting point (see co-pending application Apparatus And Method For Inspecting Wire Bonds On Leads, Attorney Docket Number C95-007) and a binarization threshold to distinguish crescent 60 from the lead background.

Since in practice crescent 60 is known to have approximately the same grey value as the dark portion of wire 50, and the background value for lead 30 is the same for both, a threshold value can be computed that can be used to find crescent 60 and distinguish crescent 60 from lead 30. The present invention computes a threshold based on the pixel intensity or grey value of the edges of wire 50 which joins crescent 60.

Figure 2A:
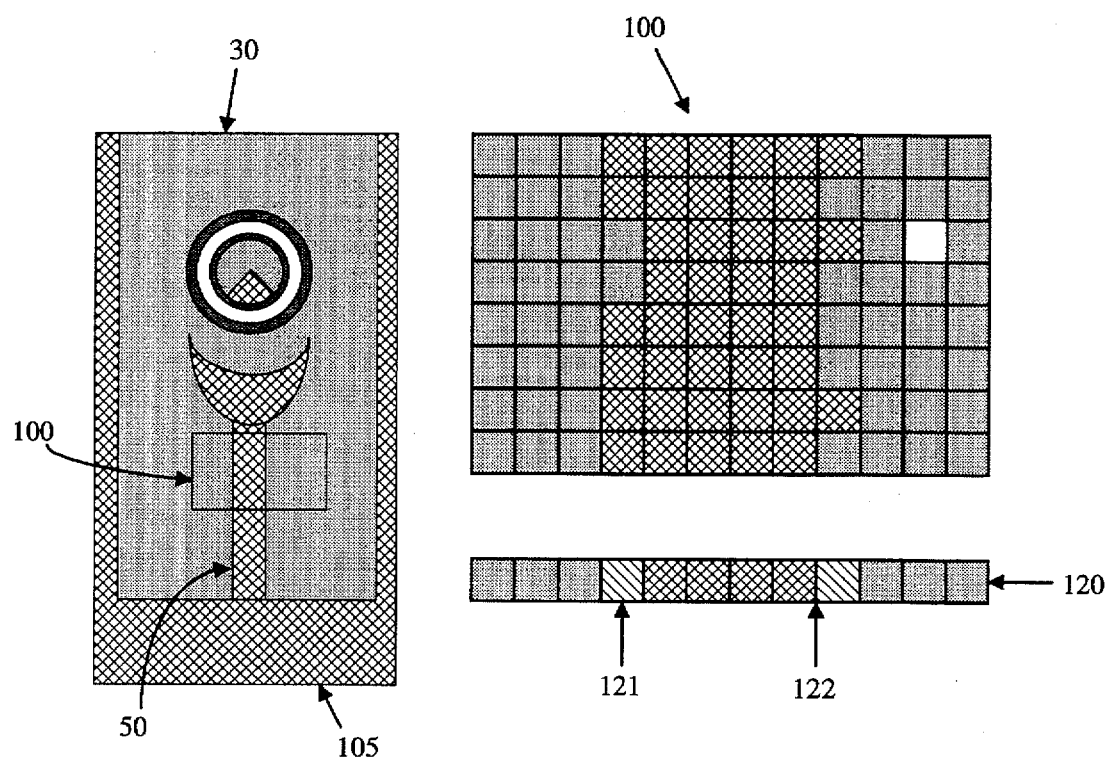
FIG. 2a is a schematic view of a two-dimensional inspection window and a one-dimensional projection of part of post-bond image of a wire.

Turning now to FIG. 2a, post-bond image 105 of a wire 50 bonded to a lead 30 is shown. In a preferred embodiment of the present invention, a relatively small two-dimensional inspection window 100, is projected within post-bond image 105 at the angle of wire 50. The present invention presumes the wire and its angle have already been found and uses the nominal locations and values for these that are provided to it by the above-referenced co-pending applications. In the example shown in FIG. 2a, inspection window 100 is 8 pixels long and 12 pixels wide, or 8 rows and 12 columns. Inspection window 100 for the image in FIG. 2a has a number of dark pixels 111 in the middle that are part of wire 50. Reflective spot 112 has a very light grey value and lead pixels 113 have a medium gray value.

In a preferred embodiment of the present invention, each of the columns in inspection window 100 are summed into a one-dimensional projection 120, which has 12 bins 120a, one for each column of inspection window 100. Each result is then averaged or normalized by dividing the sum in each bin 120a by the number of pixels that contributed to it. In this case, there are 8 pixels or rows in each column.

Still in FIG. 2a, the present invention then uses any of a number of commonly available edge detection tools to find edges 121 and 122 in the one-dimensional projection 120. In the example shown in FIG. 2a, only two edges will be found, since there are no reflective stripes in the image and the wire does not lie outside the edge of lead 30. In a preferred embodiment, these edges can be further evaluated for contrast level and width. If they meet the user supplied contrast and width requirements, they will be used for computing the threshold as follows:

If an edge point falls directly in the center of a pixel, the grey value for that edge point is considered to be the grey value of that pixel.

If the edge fails between pixels, the edge's grey value is determined by averaging the grey values of the two contributing pixels, weighted according to the fractional pixel position of the edge point.

By averaging the grey values of the left edge point (edge 121 in FIG. 2a) and right (edge 122) edge points, a threshold is computed. This is then provided to the boundary tracker.

In this example, a post-bond image was used to obtain the threshold. While this can save memory and processing time, it may not be adequate if the wire is likely to contain a reflective stripe or if it lies outside the lead edge, or if other confusing artifacts in the image make greater accuracy desirable.

Figure 2B:
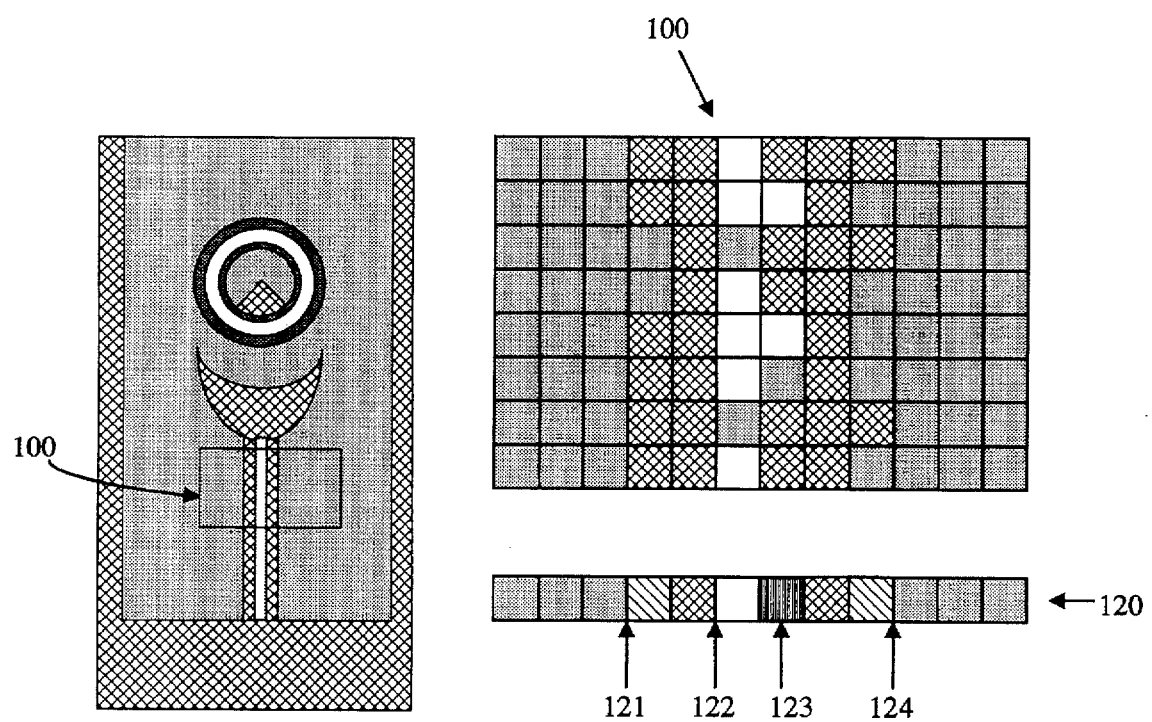
FIG. 2b is a schematic top view of a post-bond image of a wire having a reflective stripe.

With reference now to FIG. 2b, a wire 50 having a reflective stripe 57 is shown. Inspection window 100 in this example, has very light grey values in the middle, where reflective stripe 57 occurs in the image. When this inspection window 100 is summed and normalized into one-dimensional projection 120, and edge detection is done, four edges will be found, edges 121,122,123 and 124. If the grey values of reflective stripe 57 contribute to the threshold computed, then it may not yield valid results for the boundary tracker.

For example, in a system with polarities in which a pixel intensity of 0 represents black and 255 represents white, lead 30's pixels may have a grey value of 100, and reflective stripe 57's pixels may have a grey value of 200. Wire 50's pixels may have a grey value of 0 or be very close to black. Using these grey values, if edge 121 does not fall in the center of a wire pixel, its grey value will be computed based on the contributions of the two adjoining pixels around it. Thus, edge 121 could be an average of wire pixel grey value 0 and lead pixel grey value 100, yielding an average grey value of 50. Edge 122, however, will be affected by the lighter values of reflective stripe 57. When it is computed, it might be the average of reflective stripe value 200 and wire value 0, yielding an average grey value of 100. When the left edge 121's value of 50 is averaged with the right edge 122's value of 100, the resulting threshold would be a grey value of 75. If this were chosen as the threshold for the boundary tracker it could lead to inaccurate results.

Therefore, in a preferred embodiment of the present invention, a difference image of wire 50 can be used, if desired. Co-pending application C93-007FWC, referenced above, describes how such a difference image is created, by subtracting the pre- and post-bond images of the bonded wire. As described in that co-pending application, using a difference image tends to eliminate confusing artifacts created by dust or specks present on the lead 30 before bonding. The artifacts that were there before bonding will be subtracted out in the difference image and only that which is different will remain. This alone tends to improve the accuracy of the threshold selection.

In a preferred embodiment, the present invention also "clips" or shifts the pixel values in the difference image. To illustrate, subtracting 200, the grey value of reflective stripe 57 from 100, the grey value of lead 30, would yield a negative number, −100 in this example for the very light reflective stripe 57. Since the lead is lighter than the wire, a better threshold will be found by looking only for those things that got darker in the image, as they will be more likely to be parts of the wire or the crescent. Therefore, a preferred embodiment of the present invention "clips" or shifts the difference image by using only the positive numbers. This can be done either as the difference image is created or when inspection window 100 is created.

Figure 8B:
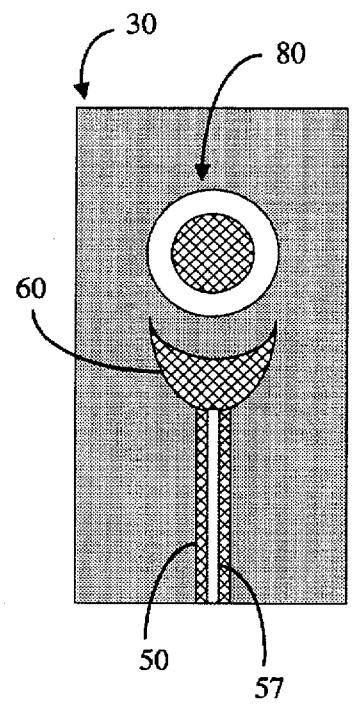
FIG. 8b shows a schematic top view of a post-bond image of a lead to which a wire has been bonded.
Figure 8C:
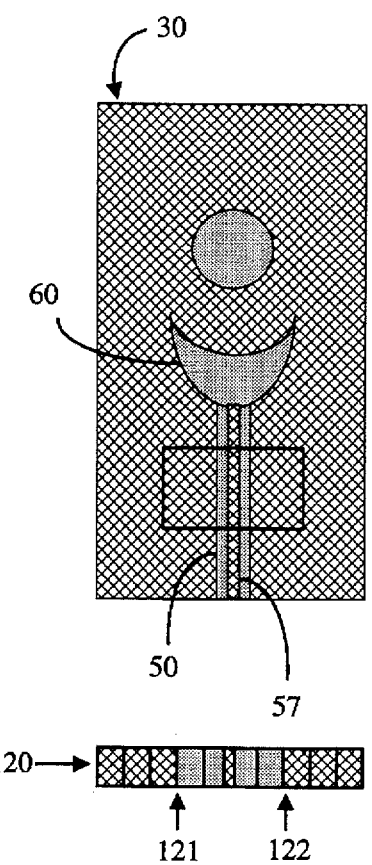
FIG. 8c shows a schematic top view of a difference image of a wire bonded to a lead.

Turning now to FIGS. 8a, 8b and 8c, the resulting effect of clipping a difference image is illustrated. If the pixel value of lead 30, shown in pre-bond image 8a is 100, it will also be 100 in post-bond image 8b. However, in difference image 8c, subtracting 100 from 100, yields a value of 0 or black for the lead 30. Subtracting 200, the value of reflective stripe 57, in FIG. 8b, from 100, the value of lead 30 in pre-bond image 8a, would result in a negative 100. Since a preferred embodiment of the present invention clips out all negative values and sets them to 0, it has the effect of eliminating the contrast or at least lowering the brightness of all the elements in the post-bond image that got brighter. Thus, reflective stripe 57 does not appear or at least is not much different in value from the wire in the clipped or shifted difference image 8c.

Note that after clipping, wire 50 in FIG. 8c has a grey value of 100 and lead 30 has a grey value of 0, so the average grey value for edge 121 would be 100+0 divided by 2, or 50. The same is true of edge 122 now—its value will be 50. When these two are added and averaged, the threshold computed will be 50, which will produce much more accurate results in this example for the boundary tracker.

Figure 3A:
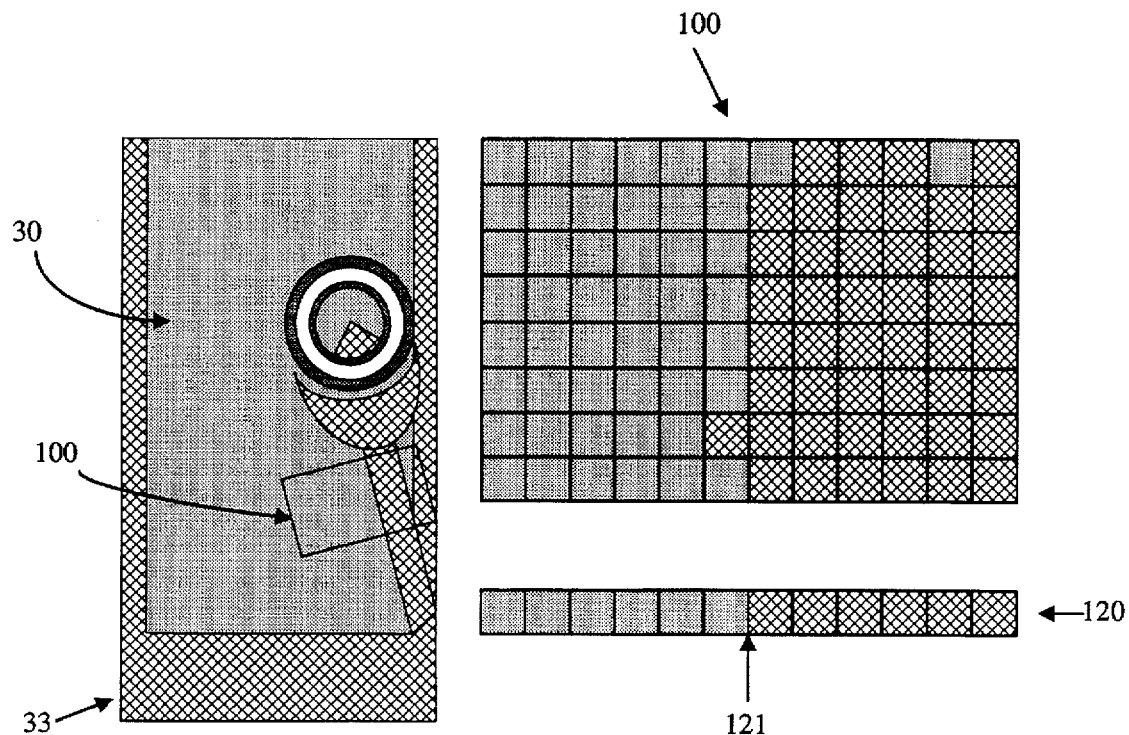
FIG. 3a is a schematic top view of post-bond image of a wire lying outside the lead edge.

Turning now to FIG. 3a, a top view of a post-bond image of a wire 50, bonded to a lead 30 is shown in which wire 50 lies outside the edge of lead 30 and extends over heat plate 33. Heat plate 33 is usually black, and would thus have a grey value of 0 in the polarity scheme used in the examples so far. Thus, when inspection window 100 is placed at the angle of wire 50, it will include black pixels not only from wire 50, but also from heat plate 33. As is illustrated in projection 120, the left edge 121, of wire 50 may be found, but right edge 122 may not have sufficient contrast to be detected. Even if an edge is found there, its pixel values may be distorted toward the darker values so much they will produce an inaccurate threshold. In the same way as described for the stripe, use of a clipped difference image for these cases will result in a much better threshold.

Figure 3B:
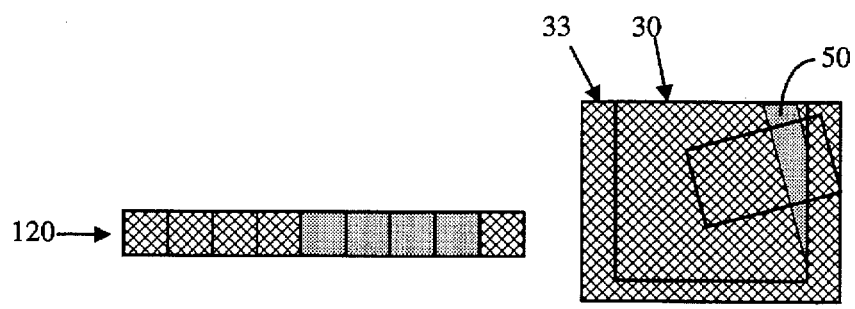
FIG. 3b is a schematic top view of a difference image of a wire lying outside the lead edge.

FIG. 3b is illustrative of such a difference image. In this example, the grey value of wire 50 changes to 100, thus appearing brighter than either lead 30 or heat plate 33, in the clipped difference image. A one-dimensional projection 120 using this clipped difference image is more likely to find two edges from which a good threshold can be computed.

A preferred embodiment of the present invention is implemented in the C programming language for Coguex Corporation's vision processing systems, but as will be apparent to those skilled in the art, the invention could be implemented in other programming languages, such as C++, or assembler, or ADA or Pascal, or could be implemented in whole or in part in firmware or special circuitry.

Those skilled in the art will appreciate that the embodiments described above are illustrative only, and that other systems in the spirit of the teachings herein fall within the scope of the invention.

A preferred embodiment of the present invention also includes a camera or other device for generating a video or image signal. The video signal generated by the camera is typically converted from analog to digital by techniques well known in the art and sent to an image memory, such as a frame grabber, or similar device for storing images. A vision processor system, which includes a computer central processing chip, and input/output capabilities, is coupled to the image memory and is used to perform image processing and analysis according to the present invention. Portions of image processing and analysis are accomplished by software programs controlling the vision processor system, or, as will be evident to one skilled in the art, can be controlled by equivalent circuits created in special integrated circuit chips. The results of image processing and analysis are transmitted electronically to the apparatus or system requiring the machine vision results. Alternatively, the machine vision function can be incorporated within and work as part of a larger system.

What is claimed is:

1. A method for selecting a threshold value for use by a boundary tracker for locating a crescent in an image of a wire bonded to a lead comprising:

creating a two-dimensional inspection window within said image of said wire bonded to a lead along the angle of the wire, such that said two-dimensional inspection window contains a plurality of rows and columns of pixel values within said image of a wire bonded to a lead;

generating a one-dimensional projection by summing and normalizing each column of said pixel values into a one-dimensional array having a number of bins corresponding to the number of columns in said inspection window;

detecting edges in said one-dimensional projection;

computing pixel values for said threshold from the edges detected in said detecting edges step and providing said pixel values as said threshold to said boundary tracker.

2. The method of claim 1 wherein said image of a wire bonded to a lead is a post-bond image.

3. The method of claim 1 wherein said image of a wire bonded to a lead is a difference image.

4. The method of claim 3 wherein said difference image is clipped so that negative pixel values are eliminated.

5. The method of claim 1, wherein said step of computing pixel values for said threshold further comprises the steps of:

using the pixel values of edges found directly in the center of a pixel in said one-dimensional projection by said edge detecting step; and averaging grey values of left and right edges to create said pixel values to use in providing said threshold to said boundary tracker.

6. The method of claim 5, wherein said step of computing pixel values for said threshold further comprises the steps of:

calculating the pixel values of edges found between pixels in said one-dimensional projection by said edge detecting step by using the grey values contributed by the fractional pixel positions on either side of said edge in said one-dimensional projection.

7. An apparatus for selecting a threshold value for use by a boundary tracker for locating a crescent in an image of a wire bonded to a lead comprising:

means for creating a two-dimensional inspection window within said image of said wire bonded to a lead along the angle of the wire, such that said two-dimensional inspection window contains a plurality of rows and columns of pixel values within said image of a wire bonded to a lead;

means for generating a one-dimensional projection by summing and normalizing each column of said pixel values into a one-dimensional array having a number of bins corresponding to the number of columns in said inspection window;

means for detecting edges in said one-dimensional projection;

means for computing pixel values for said threshold from the edges detected by said means for detecting edges and providing said pixel values as said threshold to said boundary tracker.

8. The apparatus of claim 7, wherein said means for computing pixel values for said threshold further comprises the steps of:

means for using the pixel values of edges found directly in the center of a pixel in said one-dimensional projection by said edge detecting step; and means for averaging grey values of left and right edges to create said pixel values to use in providing said threshold to said boundary tracker.

9. The apparatus of claim 8, wherein said means for computing pixel values for said threshold further comprises:

means for calculating the pixel values of edges found between pixels in said one-dimensional projection by said means for detecting edges by using the grey values contributed by the fractional pixel positions on eider side of said edge in said one-dimensional projection.

10. The apparatus of claim 7 wherein said image of a wire bonded to a lead is a post-bond image.

11. The apparatus of claim 10 wherein said image of a wire bonded to a lead is a difference image.

12. The apparatus of claim 11 wherein said difference image is clipped so that negative pixel values are eliminated.

* * * * *